United States Patent [19]

Chino et al.

[11] Patent Number: 5,321,294
[45] Date of Patent: Jun. 14, 1994

[54] SHIFT REGISTER HAVING OPTICALLY BISTABLE ELEMENTS COUPLED BY AN OPTICAL WAVEGUIDE LAYER

[75] Inventors: Toyoji Chino, Toyonaka; Kenichi Matsuda, Moriguchi, both of Japan

[73] Assignee: Matsushita Electric Industrial Co., Ltd., Osaka, Japan

[21] Appl. No.: 81,659

[22] Filed: Jun. 24, 1993

[30] Foreign Application Priority Data

Aug. 31, 1992 [JP] Japan ................... 4-230888

[51] Int. Cl.$^5$ ................... H01L 33/00; H01L 31/12; H01L 31/16
[52] U.S. Cl. ................... 257/85; 257/82; 257/83; 257/97; 257/103; 257/187; 257/446; 257/447; 257/462; 257/466; 385/130; 385/132
[58] Field of Search ................... 257/80, 81, 82, 83, 257/84, 85, 96, 97, 99, 103, 187, 444, 446, 447, 462, 466; 385/130, 132

[56] References Cited

U.S. PATENT DOCUMENTS

| Re. 32,893 | 3/1989 | Miller | 257/80 |
|---|---|---|---|
| 4,521,681 | 6/1985 | Inaba et al. | 257/82 |
| 4,675,518 | 6/1987 | Oimura et al. | 257/85 |
| 4,933,561 | 6/1990 | Goransson et al. | 257/83 |
| 5,014,096 | 5/1991 | Matsuda et al. | 257/85 |
| 5,239,189 | 8/1993 | Lawrence | 257/82 |

OTHER PUBLICATIONS

1990 Spring National Convention Record, The Institute of Electronics, Information & Communication Engineers; Part 4, Communications-Electronics Mar. 18-21, 1990, pp. 4-230; "Self-scanning Light Emitting Device (SLED) Integrated 4-phase-drive SLED & 2-phase-drive SLED-"; by Y. Kusuda et al.

Technical Research Report OQE89-141, Mar. 5, 1990, pp. 43-47, "Proposal of the Self-scanning Light Emitting Device Using PNPN-thyristor"; by Y. Kusuda et al.

Extended Abstracts, The Autumn Meeting; Sep. 26-29, 1990, pp. 786; "2-dimensional Self-scanning Light Emitting Device".

Primary Examiner—Ngan Ngo
Attorney, Agent, or Firm—Ratner & Prestia

[57] ABSTRACT

A shift register according to the present invention includes: a plurality of first electrodes; at least one second electrode; a voltage application unit for applying a voltage to each of the plurality of first electrodes; a plurality of optically bistable elements connected to each of the plurality of first electrodes and at least one second electrode; and an optical waveguide layer for optically coupling the plurality of optically bistable elements to each other.

8 Claims, 8 Drawing Sheets

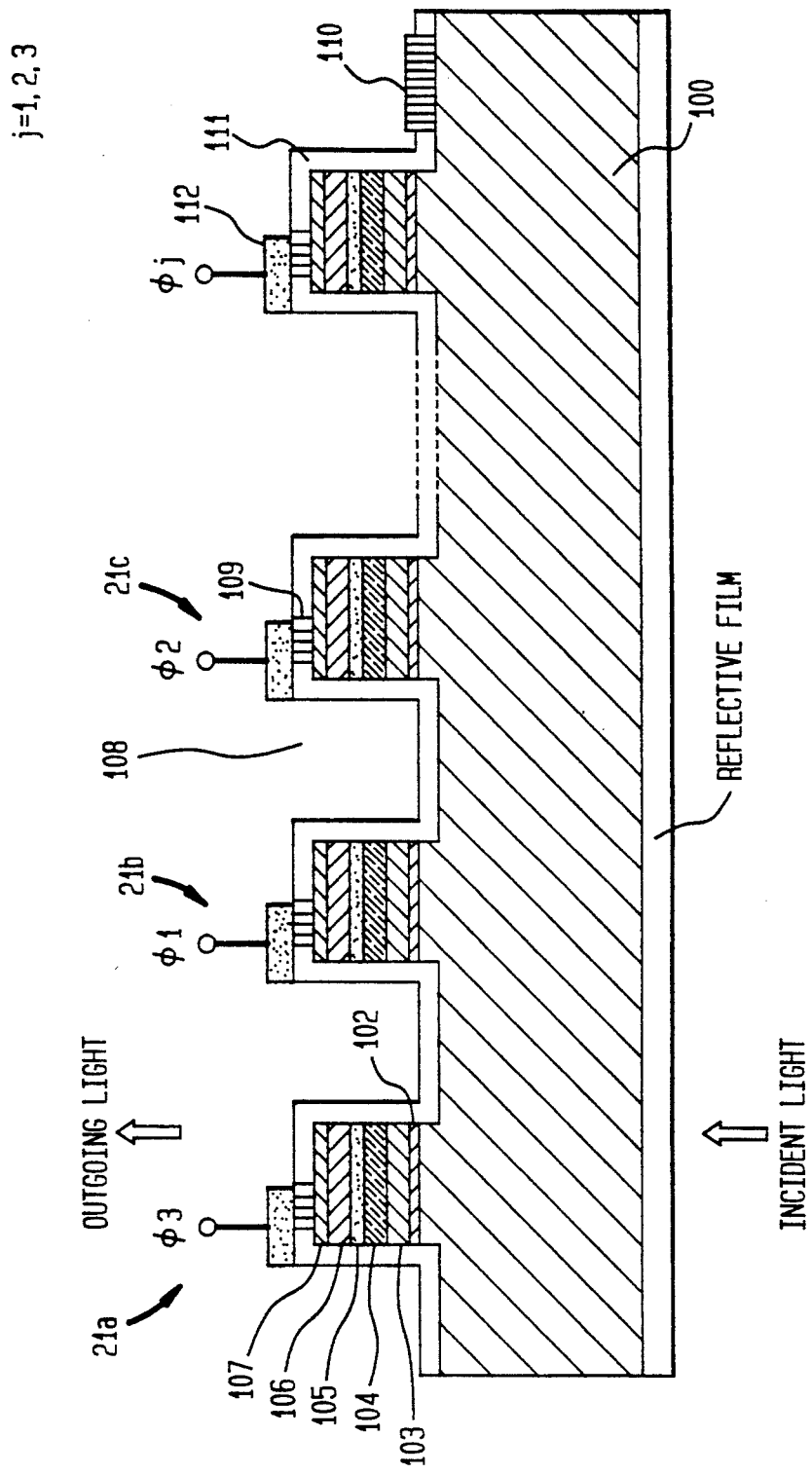

SHIFT REGISTER HAVING OPTICALLY BISTABLE ELEMENTS COUPLED BY AN OPTICAL WAVEGUIDE LAYER

BACKGROUND OF THE INVENTION

1. Field of the Invention

The present invention relates to a shift register for shifting an optical signal, and more particularly to a shift register having optically bistable elements. This kind of shift register is used in the field of optical electronics.

2. Description of the Related Art

In general, a device, in which a plurality of elements respectively take a bistable state and the state of an element is successively transferred to another adjacent element, is referred to as a shift register. A flip-flop circuit and a charge coupled device (CCD) have been known as elements which take an electrically bistable state.

Several kinds of shift registers having a plurality of optically bistable elements have been suggested. See, for example, Collection of Lecture Theses (The Spring National Meeting, 1990), The Institute of Electronics, Information and Communication Engineers, pp. 4-23; Technical Research Report OQE89-141, The Institute of Electronics, Information and Communication Engineers; and Extended Abstracts, p. 786 (The Autumn Meeting, 1990), The Japan Society of Applied Physics.

FIG. 8 shows a conventional shift register having a plurality of optically bistable elements. This shift register includes a p-GaAs substrate and a plurality of light-emitting thyristors provided on the p-GaAs substrate. Each thyristor is formed of a first p-GaAs layer (anode layer), a first n-GaAs layer, a second p-GaAs layer (gate layer), and a second n-GaAs layer (cathode layer), which are layered in this order. Each second p-GaAs layer is provided with a gate electrode 800. A voltage of $-5$ V is supplied to each gate electrode 800 through a resistance network by a dc power source $V_{GA}$. Each second n-GaAs layer is provided with a cathode electrode. Three-phase clock voltages $\phi 1$, $\phi 2$, and $\phi 3$ are applied to each cathode electrode. The p-GaAs substrate is grounded, whereby a voltage of 0 V is applied to each first p-GaAs layer (anode layer).

When the clock voltage $\phi 3$ applied to the cathode electrode of the third light-emitting thyristor increases from a Low level to a High level at a certain time, the third light-emitting thyristor is turned ON and starts emitting light. Then, the electrical potentials of the gate electrode and the second p-GaAs layer (gate layer) become almost equal to the electrical potential (0 V) of the first p-GaAs layer (anode layer). Because of this, a current flows between the gate layer and the cathode layer of the third light-emitting thyristor through the resistance network. As a result, under the condition that the electrical potential (about 0 V) of the second p-GaAs layer (gate layer) of the third light-emitting thyristor is a peak value, electrical potentials stepwise distributed are applied to each gate electrode 800. Thus, smaller voltages are applied to thyristors which are positioned further away from the third light-emitting thyristor. For example, the voltage applied to the gate electrode 800 of the fourth light-emitting thyristor is higher than that applied to the gate electrode 800 of the first light-emitting thyristor.

When the clock voltage $\phi 1$ becomes High level at a subsequent time, a high voltage is applied to the respective cathode electrodes of the first and fourth light-emitting thyristors. At this time, only the fourth light-emitting thyristor, the gate electrode 800 of which has a relatively high electrical potential, is turned ON to start emitting light; while the first light-emitting thyristor, the gate electrode 800 of which has a relatively low electrical potential, is not turned ON.

After that, when the clock voltage $\phi 1$ is changed from a High level to a Low level, the third light-emitting thyristor is turned OFF to stop emitting light. Thus, the light-emitting state is shifted from the third light-emitting thyristor to the fourth light-emitting thyristor.

However, in the above-mentioned conventional shift register, it is required to provide each light-emitting thyristor with a gate electrode and to form a complicated resistance network on the substrate. Because of this, elements other than the light-emitting thyristors occupy a large area on the substrate, making it difficult to integrate a number of thyristors on the substrate.

SUMMARY OF THE INVENTION

The shift register of the present invention, includes: a plurality of first electrodes; at least one second electrode; a voltage application unit for applying a voltage to each of the plurality of first electrodes; a plurality of optically bistable elements connected to each of the plurality of first electrodes and at least one second electrode; and an optical waveguide layer for optically coupling the plurality of optically bistable elements to each other, wherein each of the plurality of the optically bistable elements has a phototransistor and a light-emitting element which are connected in series to each other, the phototransistor and the light-emitting element being connected to each other between the corresponding first electrode and at least one second electrode;

the phototransistor changes an electrically non-conductive state between the corresponding first electrode and at least one second electrode to an electrically conductive state, when receiving light while a predetermined voltage is applied between the corresponding first electrode and at least one second electrode, whereby a current flows through the light-emitting element, and the light-emitting element emits light when the current flows therethrough, and provides the photo-transistor with part of the light and a phototransistor of another optically bistable element with another part of the light through the optical waveguide layer.

In one embodiment, the phototransistor is a heterojunction phototransistor having an emitter region, a base region, and a collector region; and the light-emitting element is a diode having a terminal connected to either one of the collector region or the emitter region of the heterojunction phototransistor.

In another embodiment, the optical waveguide layer has a semiconductor layer capable of guiding light emitted from the light-emitting element; and the plurality of optically bistable elements are arranged on the semiconductor layer.

In another embodiment, the semiconductor layer is formed on the semiconductor substrate.

In another embodiment, the semiconductor layer is a semiconductor substrate having a reflective film on a back face thereof.

In another embodiment, the optical waveguide layer has a semiconductor layer capable of guiding light emitted from the light-emitting element; and the semiconductor layer also functions as an emitter region of the plurality of phototransistors.

In another embodiment, the optical waveguide layer has a semiconductor layer capable of guiding light emitted from the light-emitting element; and the semiconductor layer also functions as a collector region of the plurality of phototransistors.

In another embodiment, the semiconductor layer has an energy gap larger than that of the light emitted from the light-emitting element.

Thus, the invention described herein makes possible the advantage of providing a shift register having optically bistable elements which is suitable for high integration.

This and other advantages of the present invention will become apparent to those skilled in the art upon reading and understanding the following detailed description with reference to the accompanying figures.

BRIEF DESCRIPTION OF THE DRAWINGS

FIG. 9 is a cross sectional view of an alternate embodiment of the shift register in FIG. 1.

DESCRIPTION OF THE PREFERRED EMBODIMENTS

Hereinafter, the present invention will be described by way of illustrating examples with reference to the drawings.

EXAMPLE 1

Figure 1:
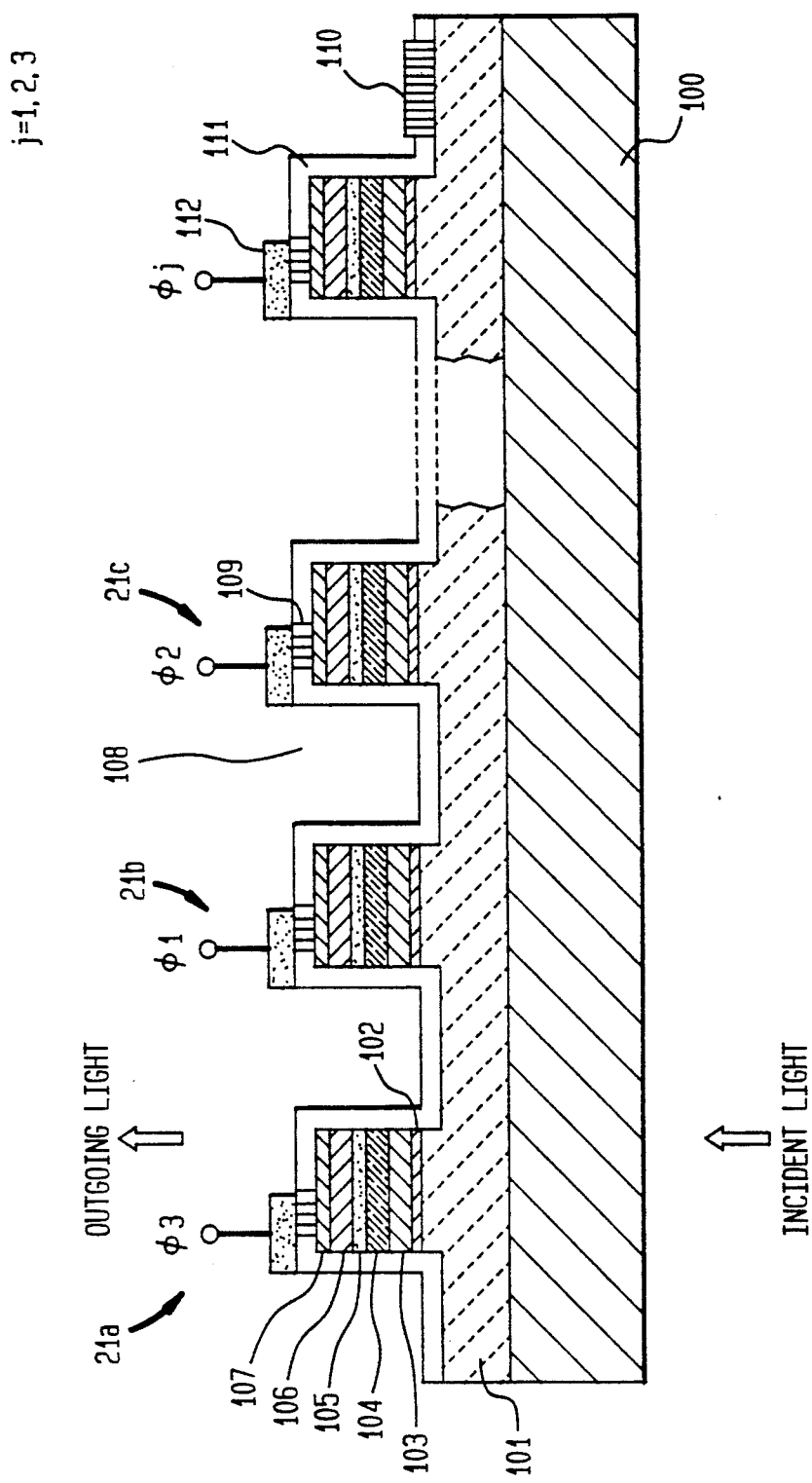
FIG. 1 is a cross-sectional view of a shift register according to the present invention.
Figure 2:
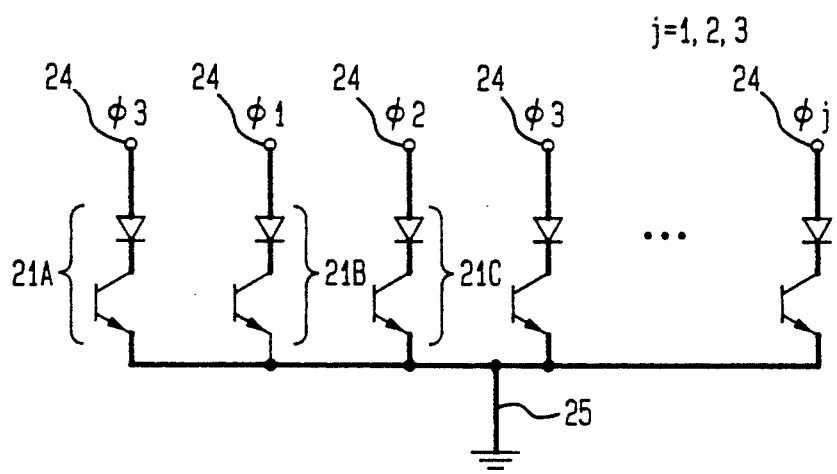
FIG. 2 shows an equivalent circuit of the shift register shown in FIG. 1.

FIG. 1 is a cross-sectional view of an example of a shift register according to the present invention. FIG. 2 shows an equivalent circuit thereof.

Referring to FIG. 2, the shift register includes a plurality of first electrodes (anode electrodes) 24 and one second electrode (cathode electrode) 25. A predetermined bias voltage (clock voltage) is applied to each anode electrode 24 by a voltage supply unit (not shown). A plurality of optically bistable elements 21 are connected between each of the plurality of anode electrodes 24 and the single cathode electrode 25.

Each optically bistable element 21 can take either a light-emitting state or a non-light-emitting state. For example, the light-emitting state corresponds to a logic "High" state, and the non-light-emitting state corresponds to a logic "Low" state. These optically bistable elements 21 are optically connected to each other by an optical waveguide layer (not shown in FIG. 2). According to the present invention, the "light-emitting state" of one optically bistable element (e.g., 21b) is shifted via the optical waveguide layer to another bistable element (e.g., 21c) to which a predetermined voltage is applied. More specifically, light emitted from the optically bistable element (e.g., 21b) which is in a light-emitting state is optically transferred to another bistable element (e.g., 21c). On the other hand, according to the conventional shift register, light emitted from one light-emitting thyristor in a light-emitting state does not optically influence another light-emitting thyristor. In the conventional shift register, the shift of a light-emitting state is electrically performed. In this respect, the shift register according to the present invention is greatly different from the conventional one.

Figure 4:
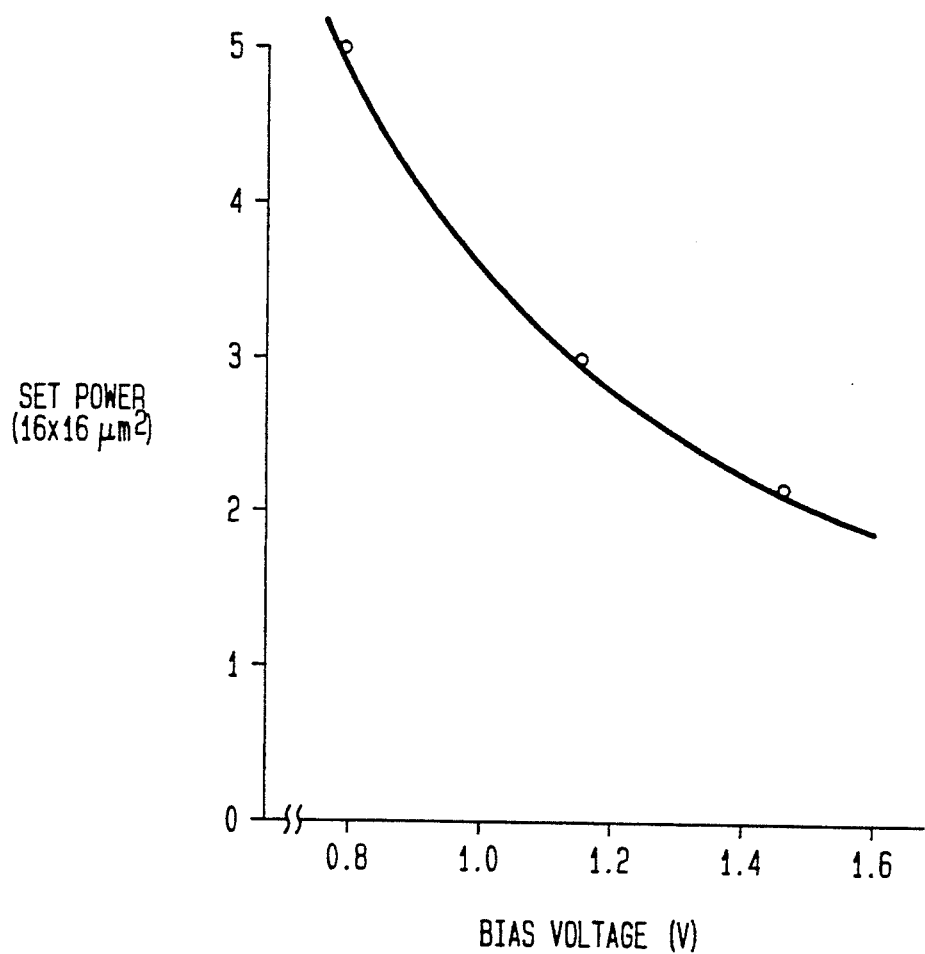
FIG. 4 is a graph showing the relationship between the set power and the bias voltage.

Each optically bistable element 21 used in the present example has a light-emitting element (represented as a diode in FIG. 2) and a phototransistor (represented as a bipolar transistor in FIG. 2) between the anode electrode 24 and the cathode electrode 25. The light emitting element and the phototransistor are connected in series. The photo-transistor is changed from an electrically non-conductive state to an electrically conductive state, when its base region receives a predetermined amount or more of light from outside while a predetermined amount or more of voltage is applied between the anode electrode 24 and the cathode electrode 25. The relationship between the predetermined amount of voltage and the predetermined amount of light is shown in FIG. 4.

The phototransistor changes an electrically non-conductive state between the anode electrode 24 and the cathode electrode 25 to an electrically conductive state, thereby allowing a current to flow through the light-emitting element connected in series to the phototransistor. The light-emitting element converts current energy to optical energy. In the present example, a light-emitting diode (LED) is used. When the phototransistor receives light while a predetermined voltage is applied between the anode electrode 24 and the cathode electrode 25, a current flows between the anode electrode 24 and the cathode electrode 25; as a result, the corresponding light-emitting element emits light.

Part of the light emitted from the light-emitting element is given to the base region of the phototransistor of the optically bistable element (e.g., 21b) to which the light-emitting element belongs. As long as a predetermined voltage is applied between the anode electrode 24 and the cathode electrode 25, a current flows between the anode electrode 24 and the cathode electrode 25 through the light-emitting element and the phototransistor, so that light continues to be emitted from the light-emitting element. Even though the irradiation from outside which changes the phototransistor from an electrically non-conductive state to an electrically conductive state stops, the light from the light-emitting element maintains the phototransistor in a conductive state, whereby light continues to be emitted from the light-emitting element. Thus, until a predetermined amount or more of voltage stops being applied between the anode electrode 24 and the cathode electrode 25, the optically stable state of the optically bistable element (e.g., 21b) is kept a stable state due to a positive feedback is kept).

Part of the light emitted from the light-emitting element can be given to the phototransistors of other optically bistable elements (e.g., 21a and 21c) through an optical waveguide (not shown). The strength of light emitted from a specific light-emitting element is attenuated while being transferred through the optical waveguide layer. Each phototransistor which receives attenuated light is changed from an electrically non-conductive state to an electrically conductive state, if a sufficiently large voltage is applied to the optically bistable element (e.g., 21c) including that phototransistor. The graph in FIG. 4 shows the strength of incident light which can change a non-light-emitting state of the phototransistor to a light-emitting state. The electrically non-conductive state of the phototransistor of a desired optically bistable element (e.g., 21c) is changed to an electrically conductive state by regulating the level of each voltage $\phi_j$ applied to each of the plurality of anode electrodes 24. In this respect, the present invention is greatly different from the conventional one.

Next, referring to FIG. 1, the present example will be described in detail.

As shown in FIG. 1, a plurality of optically bistable elements 21 are formed on an n-InP semiconductor substrate 100. On the n-InP semiconductor substrate 100, an n-InGaAsP optical waveguide layer (thickness: 1.5 $\mu$m) is formed, functioning as an emitter layer for phototransistors of the respective optically bistable elements 21.

Each optically bistable element 21 has a phototransistor and a light-emitting diode. The photo-transistor used in the present example is a heterojunction phototransistor, including the emitter layer (optical waveguide layer 101), a p-InGaAsP base layer 102 (thickness: 0.3 $\mu$m), and an n-InP collector layer 103 (thickness: 0.6 $\mu$m). These layers are formed in this order from the bottom. The light-emitting diode includes an n-cladding layer 104 (thickness: 0.6 $\mu$m) formed of n-InP, an active layer 105 (thickness: 0.15 $\mu$m) formed of InGaAsP, a p-cladding layer 106 (thickness: 0.8 $\mu$m) formed of p-InP, and a cap layer 107 (thickness: 0.1 $\mu$m) formed of p-InGaAsP. These layers are formed in this order from the bottom.

The above-mentioned structure is manufactured, for example, as follows:

First, on the n-InP semiconductor substrate 100, the n-InGaAsP optical waveguide layer 101, the p-InGaAsP base layer 102, the n-InP collector layer 103, the n-cladding layer 104, the InGaAsP active layer 105, the p-cladding layer 106, and the p-InGaAsP cap layer 107 are successively grown by the MBE method, MOCVD method, LPE method, etc.

Then, predetermined portions of the multlayer structure thus obtained are removed by photolithography and etching techniques to obtain a structure as shown in FIG. 1. The width of a removed portion (i.e., separation groove 108) is, for example, about 40 $\mu$m and that of a portion which is not removed (i.e., optically bistable element) is, for example, about 20 $\mu$m. In this case, each optically bistable element has a size of 20 $\mu$m × 20 $\mu$m and arranged at a pitch of 60 $\mu$m.

After the above-mentioned structure is obtained, an anode electrode 109 is formed on each cap layer 107, and a cathode electrode 110 is formed on the optical waveguide layer 101. These electrodes 109 and 110 are preferably formed of a metallic material. For protecting the respective optically stable elements and the electrodes 109 and 110 from outside air, the surfaces of the optical waveguide layer 101 and the respective optically bistable elements are covered with a polyimide film 111. The anode electrodes 109 are connected to clock lines 112, respectively, and a 3-phase clock signal, for example, is applied to the anode electrodes 109 through the clock lines 112.

In the shift register shown in FIG. 1, the wavelength of light emitted from the light-emitting element is determined on the basis of an energy band gap of the active layer 105 of the light-emitting diode. The active layer 105 of the present example is formed of InGaAsP, so that the wavelength of light emitted from the light-emitting element is about 1.3 $\mu$m. In addition, the heterojunction phototransisor of the present example has the base layer 102 formed of InGaAsP, so that the phototransistor efficiently absorbs light with a wavelength of about 1.3 $\mu$m at the base layer 102. Thus, the phototransistor is changed from an electrically non-conductive state to an electrically conductive state. Because of this, the state of the heterojunction phototransistor can efficiently be changed to an electrically conductive state by light emitted from the light-emitting diode. In order to change the heterojunction phototransistor from an electrically non-conductive state to an electrically conductive state by light emitted from the light-emitting diode, materials for the active layer 105 and the base layer 102 are selected from various semiconductors so that light emitted from the light-emitting diode can efficiently by absorbed by the phototransistor. The energy band gap of the active layer 105 is preferably equal to or larger than that of the base layer 102. In the present example, the active layer 105 and the base layer 102 are formed of p-InGaAsP and have the same energy band gap.

The optical waveguide layer 101 is formed of a material which hardly absorbs light from the light-emitting element. Each material for the optical wave-guide layer 101 and the active layer 105 is selected so that the energy band gap of the optical waveguide layer 101 is larger than that of the active layer 105.

In the shift register shown in FIG. 1, the optical waveguide layer 101 is formed on the n-InP semiconductor substrate 100. Instead of this structure, the substrate itself can be used as a waveguide layer. In this case, as shown in FIG. 9, it is preferred to form a reflective film on a back face of the substrate. The reflective film reflects light emitted from the light-emitting element positioned above the substrate. As the reflective film, a high-reflectance film which is provided on the end facets of a semiconductor laser is suitable.

Figure 3:
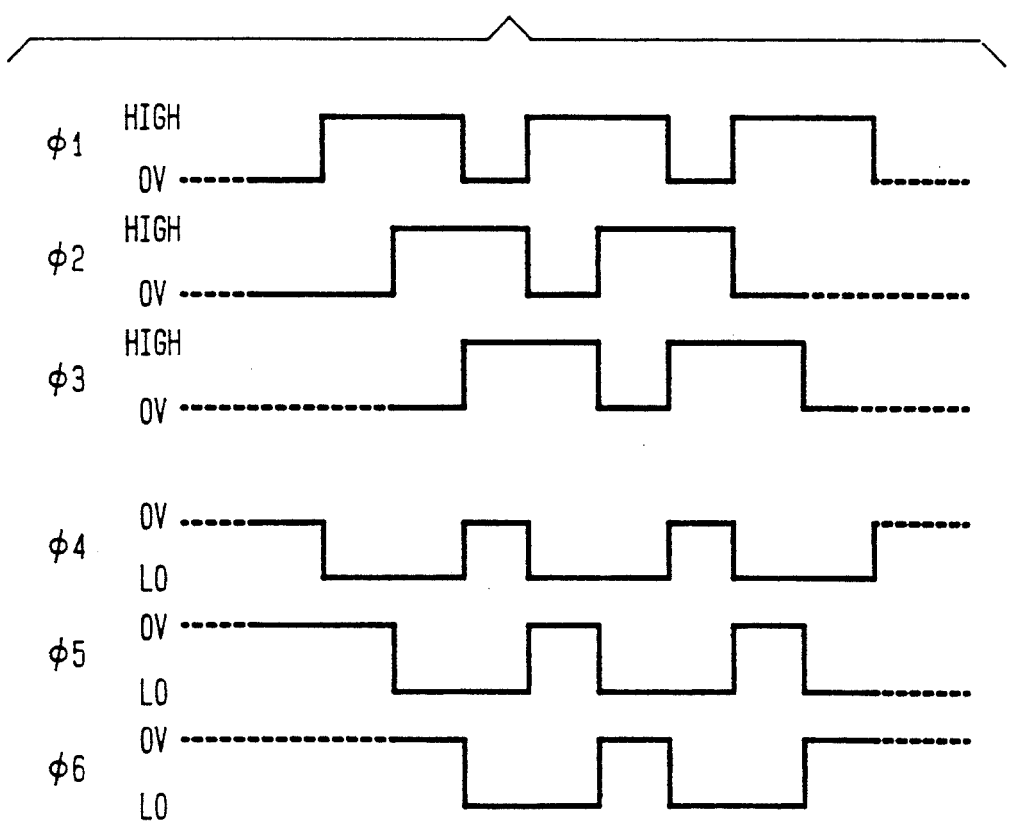
FIG. 3 shows a waveform for a voltage (clock voltage) applied to anode electrodes of the shift register shown in FIG. 1.

FIG. 3 shows a waveform of a voltage (clock voltage) to be applied to the anode electrode 109. When an optical signal is inputted from outside to the second optically bistable element 21b while a clock voltage $\phi 1$ of a high level (e.g., 1.1 V) is applied to the second optically bistable element 21b, the second optically bistable element 21b becomes light-emitting. Even though the input of the optical signal from outside stops, as described above, the light-emitting state is retained. Part of the light emitted from the second optically bistable element 21b is transferred to other optically bistable elements 21a and 21c through the optical waveguide layer 101. Part of the light which is transferred through the optical waveguide layer 101 is incident upon the first and third optically bistable elements 21a and 21c adjacent to the second optically bistable element 21b. At this time, a clock voltage $\phi 3$ applied to the first optically bistable element 21a is at a Low level (e.g., 0 V); and a clock voltage $\phi 2$ applied to the third optically bistable element 21c is at a High level (e.g., 1.1 V). Because of this, the third optically bistable element 21c becomes light-emitting by light emitted from the second light-emitting element 21b, while the first optically bistable element 21a remains in a non-light-emitting state. After this, when the clock voltage φ1 becomes Low level, the second optically bistable element 21b returns to a non-light-emitting state. Thus, the light-emitting state of the second optically bistable element 21b is shifted to the third optically bistable element 21c.

The light emitted from the second optically bistable element 21b is hardly incident upon an optically bistable element to which the clock voltage φ1 is applied (among the optically bistable elements positioned away from the second optically bistable element 21b with two or more elements sandwiched therebetween). The reason for this is as follows:

The light emitted from the second optically bistable element 21b is sufficiently attenuated while being transferred through the optical waveguide layer 101, and thus, the light cannot change the photo-transistor of the optically bistable element, to which the clock voltage φ1 is applied, from an electrically non-conductive state to an electrically conductive state. Optical energy (set power) required for changing the electrically non-conductive state of the phototransistor to an electrically conductive state depends on a bias voltage (clock voltage φj) to be applied to the anode electrode 109. As is understood from FIG. 4, when a bias voltage is increased, the optically bistable element 21 changes from a non-light-emitting state to a light-emitting state even when light at a relatively low set power is incident thereupon. It is possible to change the optically bistable elements 21, which are positioned far away from the second optically bistable element 21b emitting light, to a light-emitting state by applying sufficiently high bias voltage to the optically bistable elements 21.

As described above, the light-emitting state of one optically bistable element can be shifted to a desired optically bistable element by regulating the size of a bias voltage. Thus, in the shift register of the present example, in which a plurality of optically bistable elements 21 are aligned in an array, an optical signal can be transferred from one optically bistable element to another optically bistable element.

When an ordinary PN junction type light-emitting diode is used as a light emitting element, a bias voltage should be 0.7 V or more. If a bias voltage of less than 0.7 V is applied, even though the phototransistor becomes conductive state, the light-emitting element does not emit light. In order to stably maintain a light-emitting state by making the gain of the optically bistable element one or more, it is preferred that a bias voltage be 0.8 V or more. In addition, when a bias voltage exceeds a certain value to become too large, in some cases, the optically bistable element 21 mistakenly changes to a light-emitting state even though part of light is incident from outside. In the present example, when a bias voltage is 1.5 V or less, such problems can be solved. In the present example, the bias voltage is preferably in the range of 0.9 V to 1.1 V. However, the optimum value of a bias voltage is varied because of the optical coupling ratio between the light-emitting element and the phototransistor, so that the optimum value can be changed depending upon the size of an element and the method for processing.

In order to change the optically bistable element from a non-conductive state to a conductive state, it is required to apply a bias voltage to the anode electrode 24 for a period of time longer than a certain period. When a clock voltage as shown in FIG. 3 is used as a bias voltage to be applied, the adjacent optically bistable elements are changed to a conductive state without errors, provided that the clock width of the clock voltage is 2 microseconds or more. Because of this, according to the present example, a high-speed shift of a signal can be performed.

EXAMPLE 2

Figure 5:
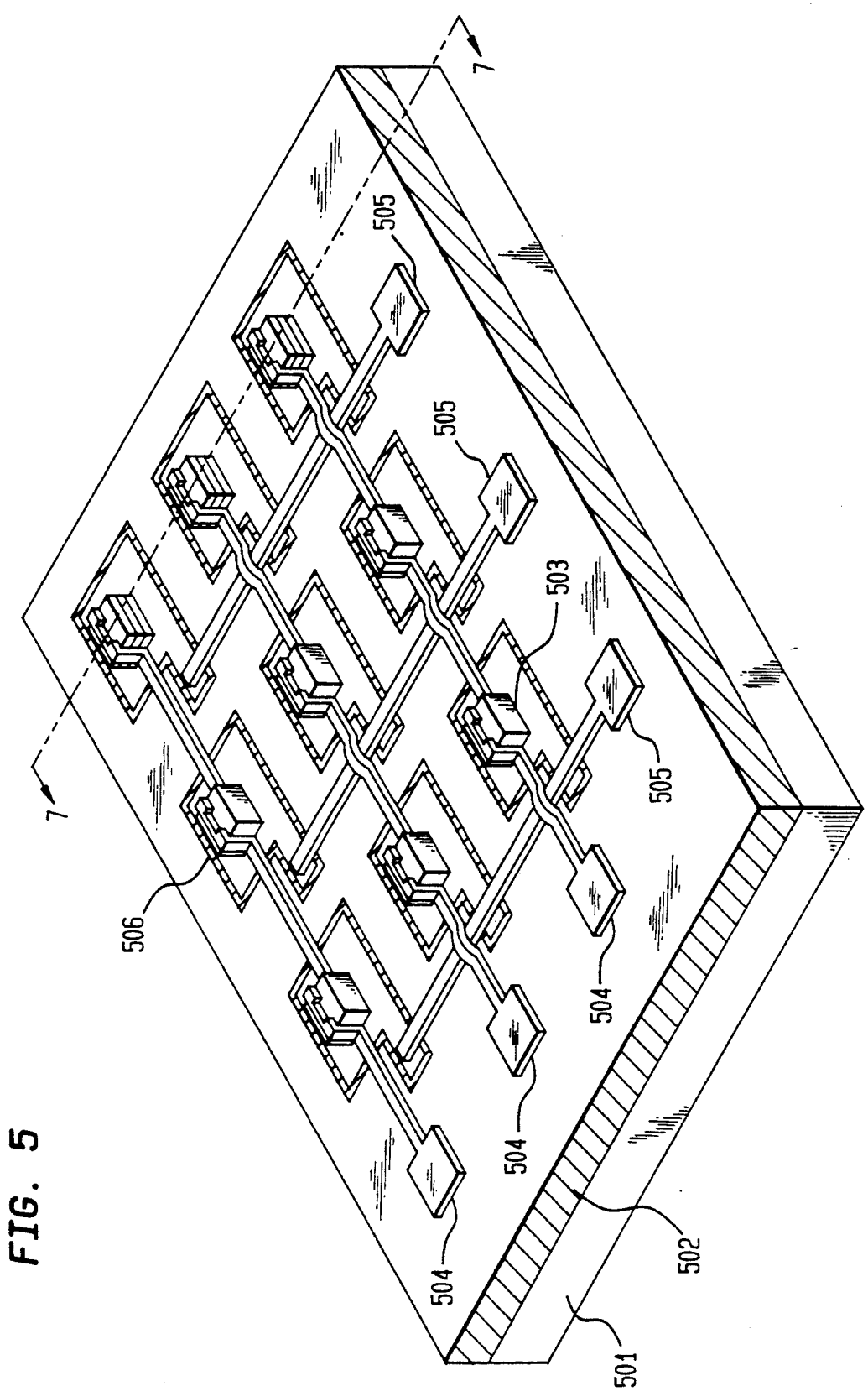
FIG. 5 shows another shift register according to the present invention.
Figure 6:
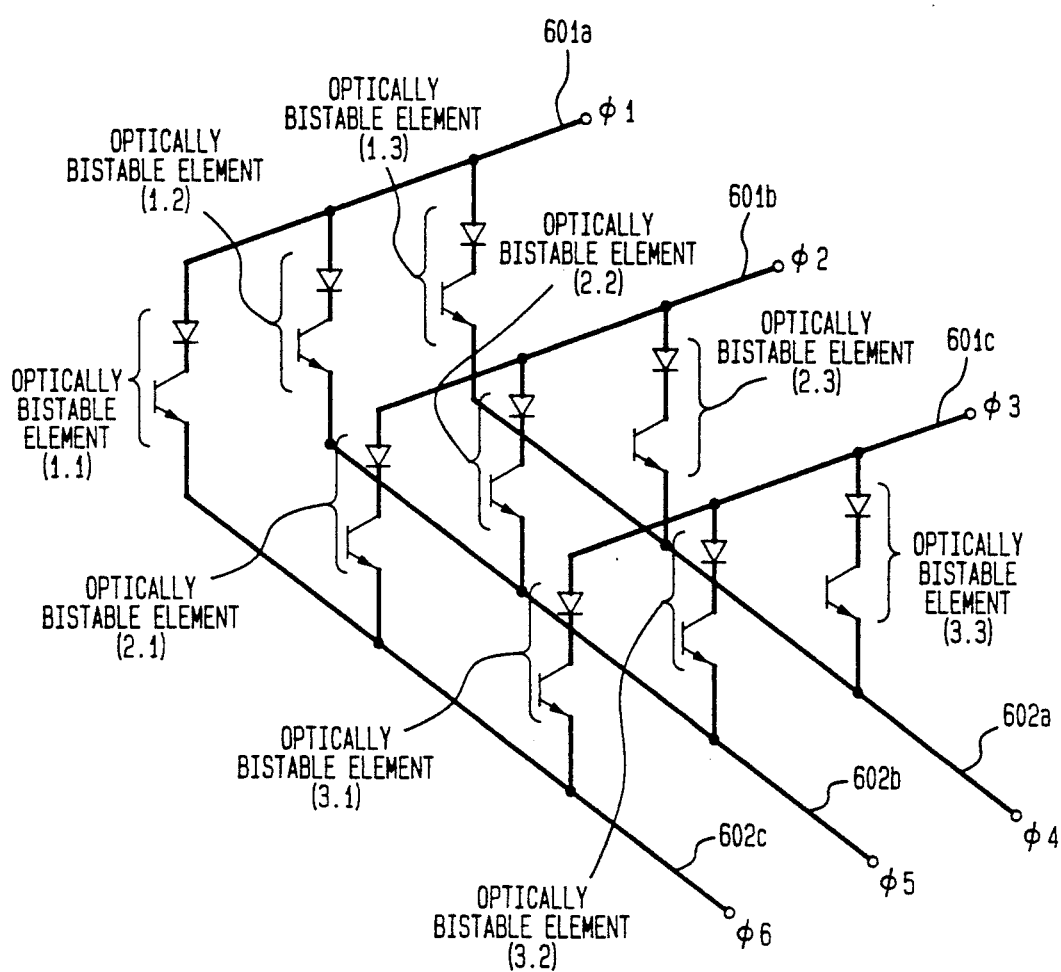
FIG. 6 shows an equivalent circuit of the shift register shown in FIG. 5.

FIG. 5 shows another shift register according to the present invention. In this shift register, optically bistable elements are two-dimensionally arranged. As shown in FIG. 5, the optically bistable elements are arranged three in a row and three in a column. FIG. 6 shows an equivalent circuit of this shift register. In FIG. 6, the optically bistable element positioned at the Nth row and the Mth column is marked (N, M).

The structure of the shift register will be described with reference to FIG. 6. The shift register includes nine first electrodes (anode electrodes) and three second electrodes (cathode electrodes). A clock voltage φ1 is applied to the anode electrodes of optically bistable elements (1, 1), (1, 2), and (1, 3) through a first word line 601a. A clock voltage φ2 is applied to the anode electrodes of optically bistable elements (2, 1), (2, 2), and (2, 3) through a second word line 601b. A clock voltage φ3 is applied to the anode electrodes of optically bistable elements (3, 1), (3, 2), and (3, 3) through a third word line 601c.

In addition, a clock voltage φ4 is applied to the cathode electrodes of optically bistable elements (1, 3), (2, 3), and (3, 3) through a first bit line 602a. A clock voltage φ5 is applied of the cathode electrodes of optically bistable elements (1, 2), (2, 2), and (3, 2) through a second bit line 602b. A clock voltage φ6 is applied to the cathode electrodes of optically bistable elements (1, 1), (2, 1), and (3, 1) through a third bit line 602c. The clock voltages φ1, φ2, φ3, φ4, φ5, and φ6 have waveforms as shown in FIG. 3.

According to the present example, the transfer of an optical signal can two-dimensionally be performed by regulating the timing of the application of a clock voltage to the bit line 602 and the word line 601 and the value of the clock voltage. Hereinafter, an example of the operation of the shift register will be described.

When the clock signal φ1 is at a High level, an optical signal is inputted from outside to the optically bistable element (1, 1). In response to the optical signal, the phototransistor of the optically bistable element (1, 1) becomes conductive state, and the light-emitting element connected in series to the phototransistor starts emitting light. The light emitted from the light-emitting element is incident upon the optical waveguide layer and is transferred to the surrounding optically bistable element through the optical waveguide layer. When the clock voltages φ1, φ2, and φ3 are applied to the word line 601, the optically bistable element (2, 1) becomes conductive to start emitting light. At this point, a voltage pulse is not applied to the bit line 602. Because of this, the optical signal is transferred in a column direction.

When a negative voltage pulse is applied to the bit line 602, the light-emitting state is transferred to the optically bistable element (1, 2). At this time a voltage pulse is not applied to the word line 601. In this case, the optical signal is transferred in a row direction.

The value of the applied voltage is regulated so that the optically bistable elements other than the optically bistable element adjacent to the optically bistable element (1. 1) do not emit light, considering the relationship shown in the graph of FIG. 4.

Figure 7:
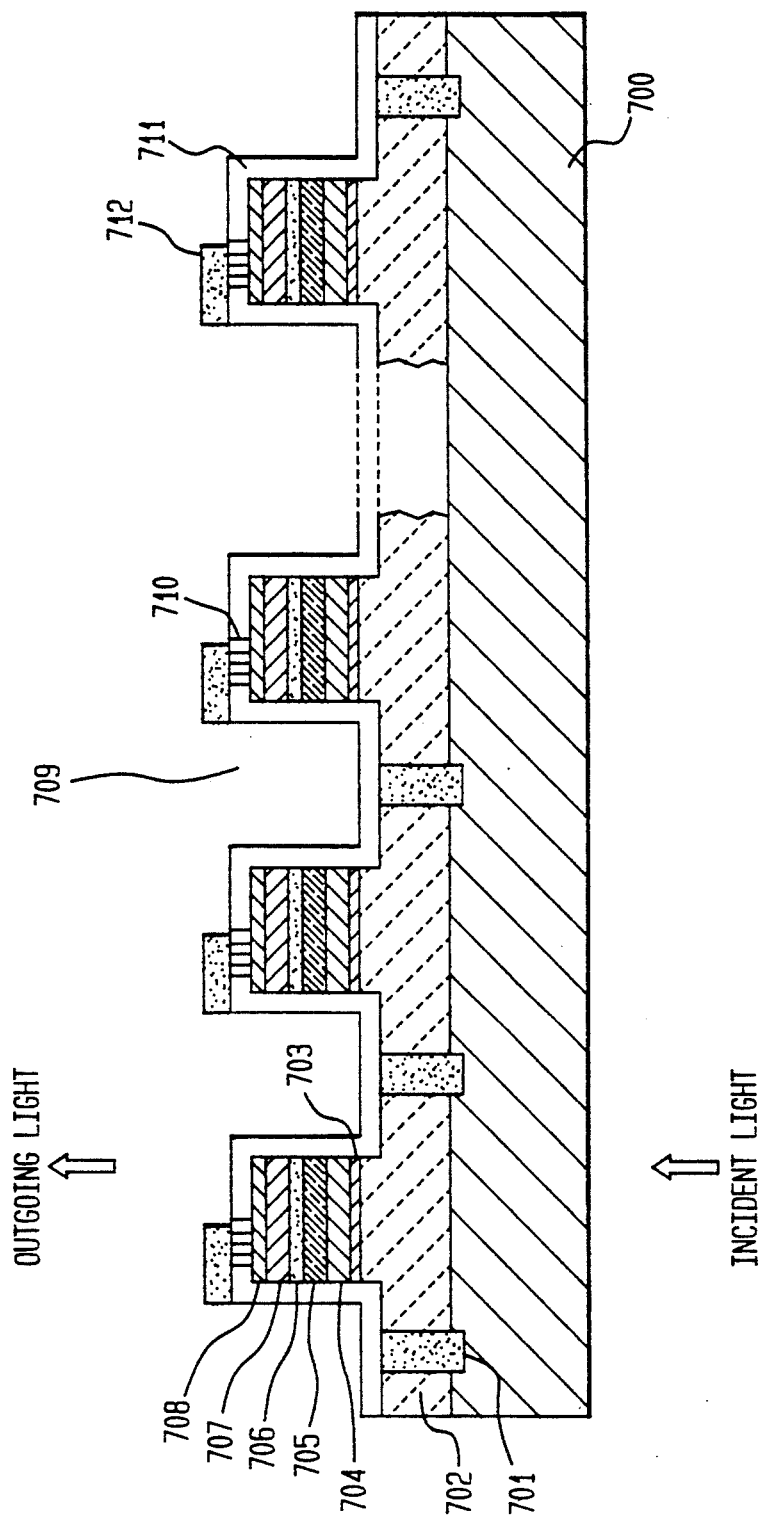
FIG. 7 is a cross-sectional view of the shift register shown in FIG. 5.
Figure 8:
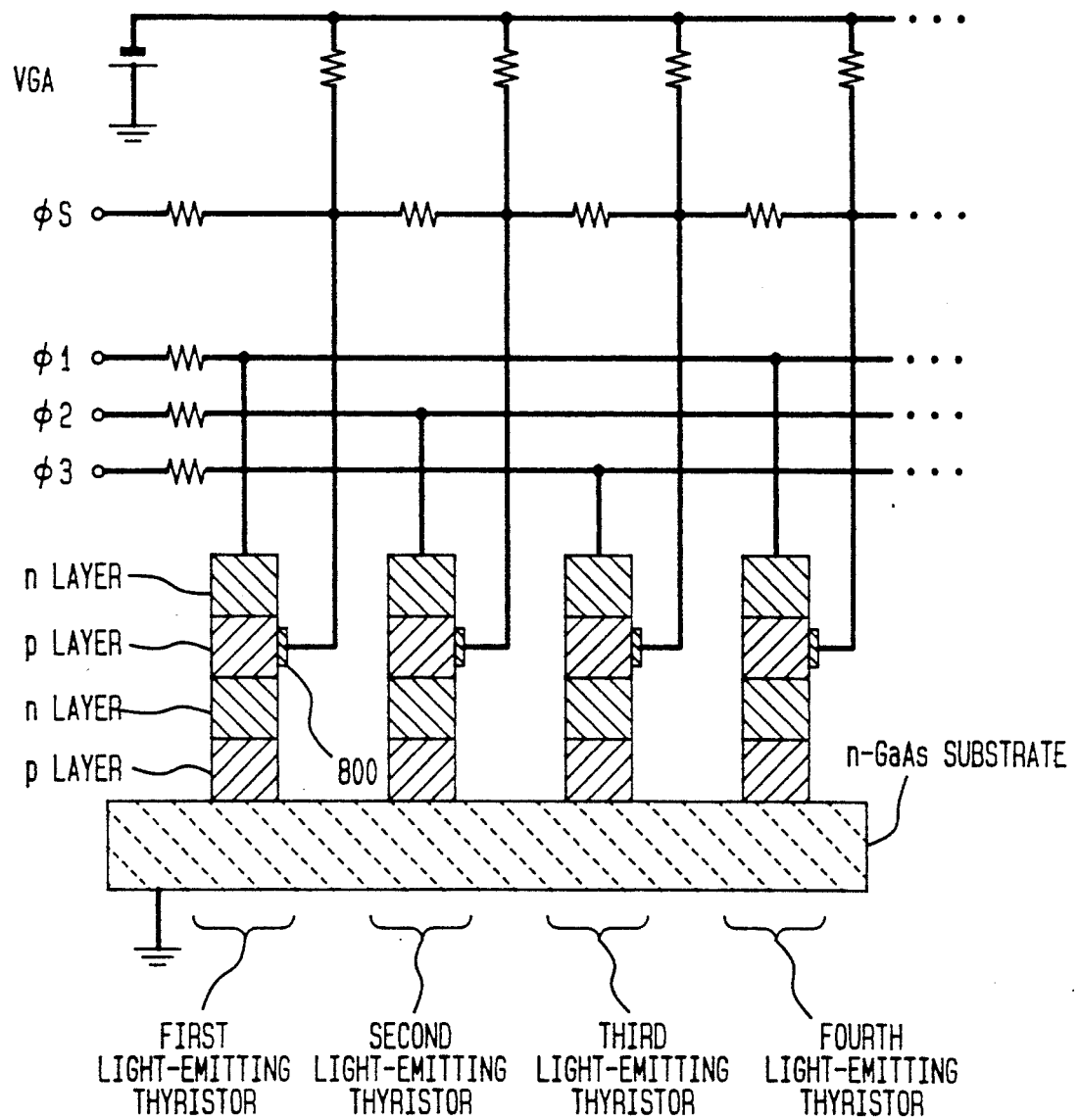
FIG. 8 is a cross-sectional view of a conventional shift register.

Next, the structure of the present example will be described in detail with reference to FIG. 7. FIG. 7 is a cross-sectional view taken along an 7—7 line of FIG. 5.

As shown in FIG. 7, in the shift register of the present example, a plurality of optically bistable elements are formed on one n-InP semiconductor substrate 700. On the n-InP semiconductor substrate 700, an n-InGaAsP optical waveguide layer 702 (thickness: 1.5 μm) is formed. The optical waveguide layer 702 also functions as an emitter layer of the phototransistor of each optically bistable element.

Each optically bistable element has a photo-transistor and a light-emitting diode. The phototransistor of the present example is a heterojunction phototransistor having an emitter layer (optical wave-guide layer 702), a p-InGaAsP base layer 703 (thickness: 0.3 μm) formed on the emitter layer, an n-InP collector layer 704 (thickness: 0.6 μm) formed on the base layer 703. The light-emitting diode has an n-cladding layer 705 (thickness: 0.6 μm) of n-InP formed on the collector layer 704, an InGaAsP active layer 706 (thickness: 0.15 μm) formed on the n-cladding layer 705, a p-cladding layer 707 (thickness: 0.8 μm) of p-InP formed on the active layer 706, and a p-InGaAsP cap layer 708 (thickness: 0.1 μm) formed on the p-cladding layer 707. In the optical waveguide layer 702, an insulating layer 701 in a lattice form is provided; and the insulating layer 701 electrically divides the respective optically bistable elements.

The present example can be produced, for example, by using the same method as that for producing the first example of the present invention.

The shift register according to the present invention includes a plurality of optically bistable elements having phototransistors and light-emitting elements connected in series to each other; and light emitted from one optically bistable element in a light-emitting state can be shifted to another optically bistable element through the optical waveguide layer. Because of this, the structure of wiring can be much more simplified, compared with the conventional example. As a result, a plurality of optically bistable elements can one-dimensionally or two-dimensionally be integrated with high density.

In addition, in the shift register according to present invention, the light-emitting state of an optically bistable element can be transferred with a short voltage pulse, achieving high-speed operation. Moreover, the light-emitting state can readily be shifted from one position to another desired position. Because of this, the present invention is expected to be applied to novel uses.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A shift register comprising:
   a plurality of first electrodes;
   at least one second electrode;
   a voltage application means for applying a voltage to each of the plurality of first electrodes;
   a plurality of optically bistable elements connected to each of the plurality of first electrodes and at least one second electrode; and
   an optical waveguide means for optically coupling the plurality of optically bistable elements to each other,
   wherein each of the plurality of the optically bistable elements has a phototransistor and a light-emitting element which are connected in series to each other, the phototransistor and the light-emitting element being connected to each other between the corresponding first electrode and at least one second electrode;
   the phototransistor changes an electrically non-conductive state between the corresponding first electrode and at least one second electrode to an electrically conductive state, when receiving light while a predetermined voltage is applied between the corresponding first electrode and at least one second electrode, whereby a current flows through the light-emitting element, and
   the light-emitting element emits light when the current flows therethrough, and provides the phototransistor with part of the light and a phototransistor of another optically bistable element with another part of the light through the optical waveguide means.

2. A shift register according to claim 1, wherein the phototransistor is a heterojunction phototransistor having an emitter region, a base region, and a collector region; and the light-emitting element is a diode having a terminal connected to either one of the collector region or the emitter region of the heterojunction phototransistor.

3. A shift register according to claim 1, wherein the optical waveguide means has a semiconductor layer capable of guiding light emitted from the light-emitting element; and the plurality of optically bistable elements are arranged on the semiconductor layer.

4. A shift register according to claim 3, wherein the semiconductor layer is formed on a semiconductor substrate.

5. A shift register according to claim 3, wherein the semiconductor layer is a semiconductor substrate having a reflective film on a back face thereof.

6. A shift register according to claim 2, wherein the optical waveguide means has a semiconductor layer capable of guiding light emitted from the light-emitting element; and the semiconductor layer also functions as an emitter region of the plurality of phototransistors.

7. A shift register according to claim 2, wherein the optical waveguide means has a semiconductor layer capable of guiding light emitted from the light-emitting element; and the semiconductor layer also functions as a collector region for the plurality of photo-transistors.

8. A shift register according to claim 6 or 7, wherein the light-emitting element has an active layer and the semiconductor layer has an energy gap larger than that of the active layer.

* * * * *